United States Patent
Nonaka et al.

(10) Patent No.: US 10,242,889 B2
(45) Date of Patent: Mar. 26, 2019

(54) SUBSTRATE LIQUID PROCESSING METHOD AND SUBSTRATE LIQUID PROCESSING APPARATUS

(71) Applicant: Tokyo Electron Limited, Tokyo (JP)

(72) Inventors: Jun Nonaka, Kumamoto (JP); Itaru Kanno, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/828,579

(22) Filed: Aug. 18, 2015

(65) Prior Publication Data

US 2016/0064257 A1    Mar. 3, 2016

(30) Foreign Application Priority Data

Aug. 26, 2014 (JP) .................. 2014-171733
Jul. 10, 2015 (JP) .................. 2015-138964

(51) Int. Cl.
*H01L 21/67* (2006.01)
*H01L 21/02* (2006.01)

(52) U.S. Cl.
CPC .... *H01L 21/67017* (2013.01); *H01L 21/0206* (2013.01); *H01L 21/02071* (2013.01); *H01L 21/6708* (2013.01); *H01L 21/67051* (2013.01)

(58) Field of Classification Search
CPC ......... H01L 21/67017; H01L 21/67051; H01L 21/6708; H01L 21/0206; H01L 21/02071; B08B 3/04; B08B 3/02
See application file for complete search history.

(56) References Cited

U.S. PATENT DOCUMENTS

| | | | | |
|---|---|---|---|---|
| 5,472,516 A | * | 12/1995 | Hanson | H01L 21/02052 134/18 |
| 5,747,251 A | | 5/1998 | Carson et al. | |
| 5,849,091 A | * | 12/1998 | Skrovan | B08B 3/102 134/1 |
| 6,158,721 A | * | 12/2000 | Katou | B01F 3/04241 261/100 |
| 6,261,845 B1 | * | 7/2001 | Verhaverbeke | G01N 35/08 134/18 |
| 6,265,781 B1 | * | 7/2001 | Andreas | H01L 21/02074 257/763 |
| 6,392,417 B1 | * | 5/2002 | Knotter | G01F 1/584 324/438 |
| 6,884,359 B2 | * | 4/2005 | Kambe | B01D 61/00 210/192 |
| 7,731,161 B2 | * | 6/2010 | Seiwert | C02F 1/685 261/26 |
| 2001/0009238 A1 | * | 7/2001 | Mosheim | C02F 1/008 210/746 |

(Continued)

FOREIGN PATENT DOCUMENTS

JP    2002-373879 A    12/2002
JP    2004-273799 A    9/2004

(Continued)

*Primary Examiner* — Sharidan Carrillo
(74) *Attorney, Agent, or Firm* — Abelman, Frayne & Schwab (57) ABSTRACT

Disclosed is a substrate liquid processing method. The method includes producing a processing liquid including deionized water, carbon dioxide, and ammonia, which has a PH of a predetermined value in a range of pH 5 to 9; and processing a substrate having a metal exposed, using the processing liquid.

8 Claims, 9 Drawing Sheets

(56) References Cited

U.S. PATENT DOCUMENTS

| | | | | |
|---|---|---|---|---|
| 2001/0020481 | A1* | 9/2001 | Gaylord, III | ............. B08B 3/08 |
| | | | | 134/61 |
| 2002/0063345 | A1* | 5/2002 | Kambe | ................. B01D 61/00 |
| | | | | 261/102 |
| 2007/0181148 | A1* | 8/2007 | Yun | ................... H01L 21/67051 |
| | | | | 134/2 |
| 2008/0257738 | A1 | 10/2008 | Seiwert et al. | |
| 2016/0064257 | A1* | 3/2016 | Nonaka | ............ H01L 21/67017 |
| | | | | 134/18 |

FOREIGN PATENT DOCUMENTS

| | | |
|---|---|---|
| JP | 2004-273894 A | 9/2004 |
| JP | 2007-103883 A | 4/2007 |
| JP | 2012-084647 A | 4/2012 |
| TW | 200425329 A | 11/2004 |

* cited by examiner

SUBSTRATE LIQUID PROCESSING METHOD AND SUBSTRATE LIQUID PROCESSING APPARATUS

CROSS-REFERENCE TO RELATED APPLICATIONS

This application is based on and claims priority from Japanese Patent Application Nos. 2014-171733 and 2015-138964, filed on Aug. 26, 2014 and Jul. 10, 2015, respectively, with the Japan Patent Office, the disclosures of which are incorporated herein in their entireties by reference.

TECHNICAL FIELD

The present disclosure relates to a substrate liquid processing method and a substrate liquid processing apparatus.

BACKGROUND

In a manufacturing process of a semiconductor device, a wet etching processing or a cleaning processing is performed on a substrate such as, for example, a semiconductor wafer by supplying a chemical liquid to the substrate. After the chemical liquid processing, a rinse processing is performed on the substrate so as to remove the remaining chemical liquid and reaction products from the substrate. The rinse processing is generally performed by supplying a rinse liquid usually composed of deionized water (DIW) to the substrate. At this time, in a case where an electrostatic breakdown might occur in device components which have already been formed on the substrate, an aqueous solution having a conductivity such as, for example, carbon dioxide dissolved water formed by dissolving carbon dioxide in deionized water, for example, by bubbling, or dilute ammonia water formed by adding a small amount of ammonia to deionized water, may be used as the rinse liquid (see, e.g., Japanese Patent Laid-Open Publication No. 2004-273799).

In order to suppress adverse effects such as corrosion of the device components, the pH of the rinse liquid may be adjusted to a proper value in a range of pH 5 to 9. However, for example, the dilute ammonia water undergoes a considerable change in pH depending on a change in ammonia concentration when the pH is 9 or less. Therefore, it is difficult to adjust the dilute ammonia water to have a desired value which is pH 9 or less. Likewise, it is also difficult to adjust the carbon dioxide dissolved water to have a desired value which is pH 5 or more.

SUMMARY

According to an exemplary embodiment, the present disclosure provides a substrate liquid processing method including producing a processing liquid including deionized water, carbon dioxide, and ammonia, which has a predetermined value in a range of pH 5 to 9; and processing a substrate having a metal exposed, using the processing liquid.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

An object of the present disclosure is to provide a technique of producing a processing liquid which has a PH of a predetermined value in a range of pH 5 to 9 and processing a substrate using the processing liquid.

According to an exemplary embodiment, the present disclosure provides a substrate liquid processing method including producing a processing liquid including deionized water, carbon dioxide, and ammonia, which has a predetermined value in a range of pH 5 to 9; and processing a substrate having a metal exposed, using the processing liquid.

In the substrate liquid processing method described above, the producing the processing liquid includes: dissolving carbon dioxide gas in the deionized water until a predetermined resistivity or conductivity is obtained; and then, adding ammonia water in the deionized water in which the carbon dioxide is dissolved to adjust the pH to the predetermined value in a range of pH 5 to 9.

In the substrate liquid processing method described above, a dissolution amount of carbon dioxide required for obtaining the predetermined resistivity or conductivity is obtained in advance, and in the dissolving the carbon dioxide gas, the predetermined dissolution amount of carbon dioxide is dissolved in the deionized water.

In the substrate liquid processing method described above, in the dissolving the carbon dioxide gas, the resistivity or conductivity of the deionized water in which the carbon dioxide is dissolved is measured, and the dissolution amount of carbon dioxide gas in the deionized water is controlled such that the measured value becomes the predetermined value or less.

In the substrate liquid processing method described above, in the adding the ammonia water, a predetermined amount of ammonia water is added to the deionized water in which the carbon dioxide is dissolved, the addition amount of ammonia water is managed based on a detection value of a measuring instrument capable of measuring the addition amount itself of the ammonia water.

In the substrate liquid processing method described above, the producing the processing liquid includes: adding ammonia water in the deionized water to adjust the pH to the predetermined value larger than pH 9; and then, dissolving carbon dioxide gas in the deionized water to which the ammonia water is added, to adjust the pH to the predetermined value in a range of pH 5 to 9 so that the predetermined resistivity or conductivity is obtained.

In the substrate liquid processing method described above, the processing liquid is used for rinsing the substrate after the substrate is subjected to a chemical liquid processing.

In the substrate liquid processing method described above, the processing liquid is used for performing a processing which is performed as a pre-treatment of the chemical processing on the substrate, and the pre-treatment is a first liquid processing that is performed on the substrate in a processing unit where the chemical processing is performed.

The substrate liquid processing method described above further includes mixing an organic solvent with the processing liquid before the processing liquid is supplied to the substrate.

According to another exemplary embodiment, the present disclosure provides a substrate liquid processing apparatus including: a processing unit configured to perform a liquid processing on a substrate using a processing liquid; a processing liquid producing unit configured to produce the processing liquid; a processing liquid supply unit configured to supply the processing liquid produced in the processing liquid producing unit to the processing unit; and a controller. The processing producing unit includes: a deionized water supply unit configured to supply deionized water; a carbon dioxide gas supply unit configured to supply carbon dioxide gas; and an ammonia water supply unit configured to supply ammonia water, and the controller controls: the processing liquid producing unit such that the deionized water, the carbon dioxide gas, and the ammonia water are mixed to produce the processing liquid having a predetermined value in a range of pH 5 to 9. The processing liquid supply unit such that the processing liquid is supplied to the processing unit to process the substrate.

In the substrate liquid processing apparatus described above, the processing liquid producing unit further includes: a tank configured to store the processing liquid; a circulation line configured to circulate the processing liquid in the tank; a deionized water line configured to supply the deionized water to the tank; and a carbon dioxide gas dissolving unit configured to dissolve the carbon dioxide gas supplied from the carbon dioxide gas supply unit in the deionized water. The carbon dioxide gas dissolving unit is interposed in the deionized water or the circulation line and dissolves the carbon dioxide gas in the deionized water flowing in the deionized water or the circulation line until a predetermined resistivity or conductivity is obtained. The ammonia water supply unit supplies the ammonia water to the tank or the deionized water such that the pH becomes the predetermined value in a range of pH 5 to 9.

In the substrate liquid processing apparatus described above, the carbon dioxide gas dissolving unit is interposed in the deionized water line, and the ammonia water supply units supplies the ammonia water to the tank.

The substrate liquid processing apparatus described above further includes a measuring instrument configured to measure the resistivity or conductivity of the deionized water in which the carbon dioxide gas is dissolved. The controller controls the carbon dioxide gas dissolving unit to dissolve carbon dioxide gas in deionized water containing no ammonia water, and after it is confirmed by the measuring instrument that the resistivity or conductivity of the deionized water containing no ammonia water in which the carbon dioxide gas is dissolved becomes a predetermined value, controls the ammonia water supply unit to add ammonia water to the deionized water containing no ammonia water in which the carbon dioxide gas is dissolved.

By dissolving carbon dioxide and ammonia in deionized water, it is possible to easily produce a processing liquid having a desired pH value in a range of pH 5 to 9. Further, by using such a processing liquid, the substrate may be processed under stable conditions.

In producing a processing liquid having a PH of a desired value in a range of pH 5 to 9, the inventors of the present application pay attention to the followings. When carbon dioxide gas and ammonia water are dissolved in deionized water, ammonium carbonate is produced by a neutralization reaction, and the following ions are present in the solution.

$$NH_3 + H_2O \longleftrightarrow NH_4^+ + OH^-$$ (Ionization Equilibrium)

$$(NH_4)_2CO_3 \rightarrow 2NH_4^+ + CO_3^{2-}$$ (Full Ionization)

That is, the solution is a buffer solution of a weak base and a salt thereof. As is known as a characteristic of the buffer solution, comparing with a solution in which $NH_3$ is solely dissolved in water, the pH of the buffer solution is smaller (closer to the neutrality), and when acid or base is added, the change in pH also becomes smaller. The inventors found that a processing liquid having a pH of a desired value in a range of pH 5 to 9 may be easily and stably produced by using the characteristic of the buffer solution.

Hereinafter, descriptions will be made on exemplary embodiments of the present disclosure, which are achieved base on the above concept, with reference to the accompanying drawings.

Figure 1:
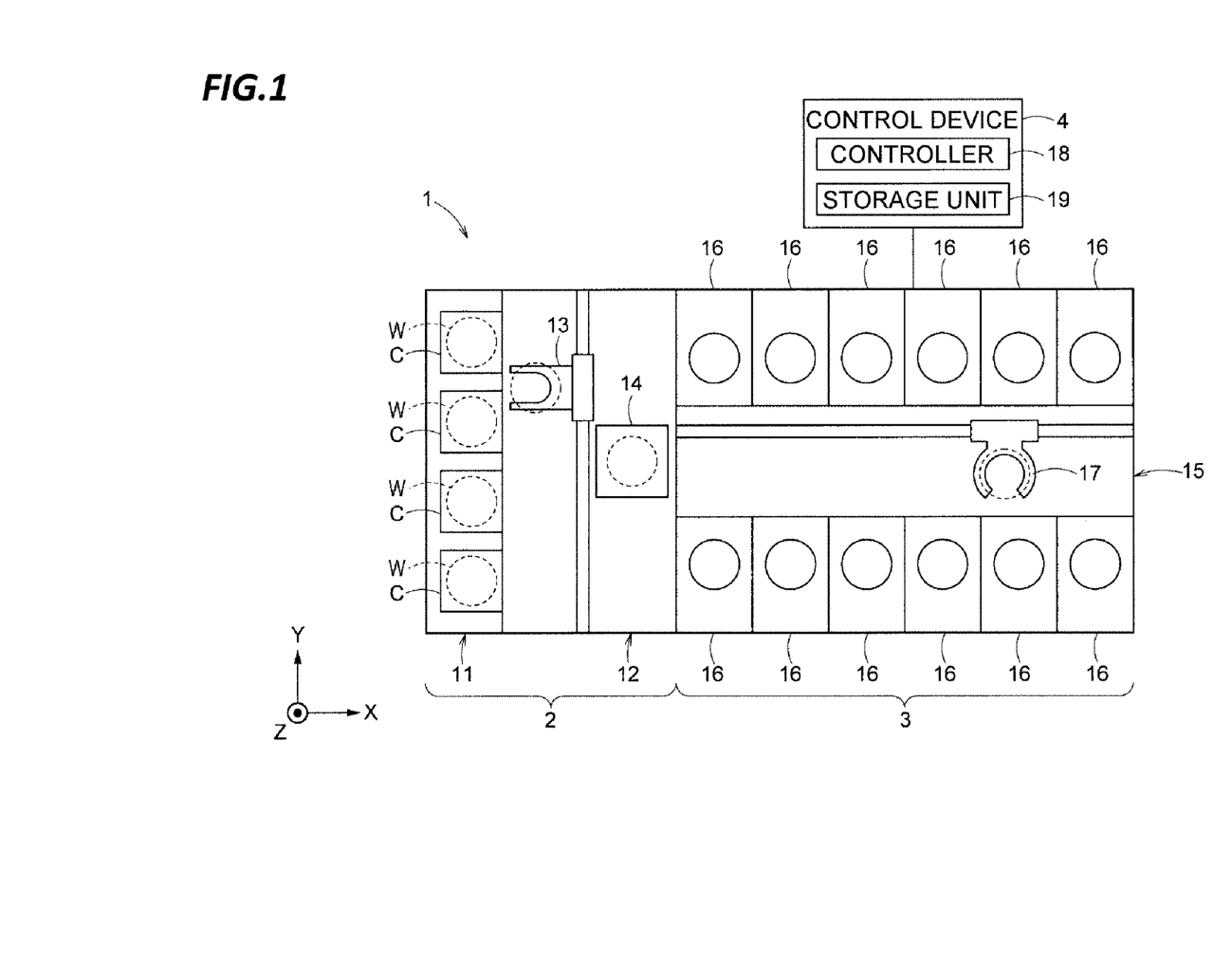
FIG. 1 is a plan view illustrating a schematic configuration of a substrate processing system according to an exemplary embodiment of a substrate liquid processing apparatus of the present disclosure.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3.

The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the liquid processing system 1 is provided with a control device 4. The control device 4 is, for example, a computer, and includes a controller 18 and a storage unit 19. The storage unit 19 stores a program that controls various processings performed in the liquid processing system 1. The controller 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
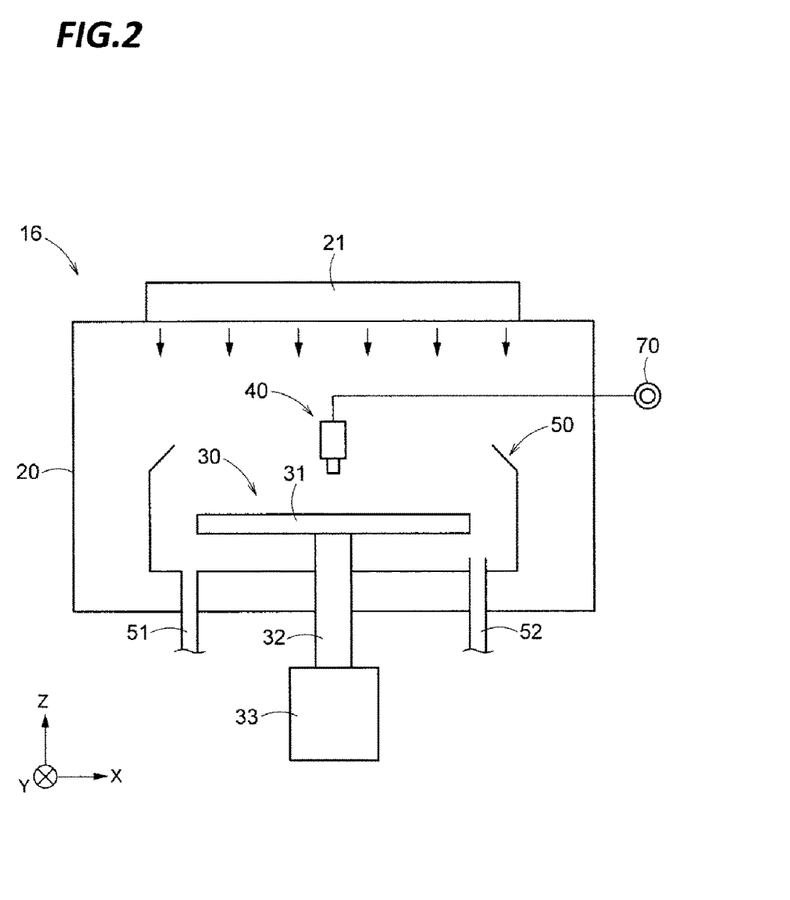
FIG. 2 is a vertical cross-sectional view illustrating a schematic configuration of the processing unit illustrated in FIG. 1.

Next, descriptions will be made on the configuration of the processing unit 16 with reference to FIG. 2. FIG. 2 is a view illustrating a schematic configuration of the processing unit 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

Next, descriptions will be made on the configuration of the processing fluid source 70 with reference to FIG. 3.

The processing fluid source 70 is a processing liquid producing unit that produces an aqueous solution having a pH of about 5 to 9 (the processing liquid used in the processing liquid supply unit 40) formed by adding ammonia water to deionized water and dissolving carbon dioxide therein. As described later, ammonia and carbon dioxide react in deionized water to form ammonium carbonate (salt), and the aqueous solution acts as a buffer solution in the presence of the ammonium carbonate. For simplification of description, the aqueous solution formed by adding ammonia water and carbon dioxide gas to deionized water will be hereinafter referred to as a "buffer solution."

The processing fluid source 70 includes a tank 701 that stores the buffer solution as a processing liquid, a carbon dioxide dissolved water supply unit 710 that supplies carbon dioxide dissolved water (carbonated water) as a raw material of the buffer solution to the tank 701, an ammonia water supply unit 720 that supplies ammonia water as a raw material of the buffer solution, and a circulation line 702 connected to the tank 701.

The circulation line 702 is provided with a pump 703 and a filter 704. The buffer solution stored in the tank 701 circulates by operating the pump 703. Contaminants such as, for example, particles contained in the buffer solution circulating in the circulation line 702, are removed by the filter 704.

The circulation line 702 is provided with a resistivity meter (or conductivity meter) 715 and a pH meter 719.

The circulation line 702 is connected with the plurality of processing units 16 described above via branch lines 705. An opening/closing valve (not illustrated) provided in each branch line 705 is opened as necessary so as to send the buffer solution to the corresponding processing unit 16 at a controlled flow rate. The processing unit 16 ejects the buffer solution as a rinse liquid (processing liquid) to the wafer W via the processing fluid supply unit 40 (including, for example, a processing liquid nozzle) so as to perform a rinse processing on the wafer W.

The carbon dioxide dissolved water supply unit 710 includes a deionized water (DIW) line 712 connected to a deionized water source 711, and a carbon dioxide gas line 717 connected to the carbon dioxide gas source 716.

The deionized water line 712 is provided with a constant pressure valve 713a, an opening/closing valve 713b, a variable throttle valve 713c, a carbon dioxide dissolution module 714, and the resistivity meter (or conductivity meter) 715 in this order from the upstream side. The constant pressure valve 713a, the opening/closing valve 713b, and the variable throttle valve 713c constitute a deionized water flow rate control mechanism 713.

The carbon dioxide gas line 717 is provided with a constant pressure valve 718a, an opening/closing valve 718b, and a variable throttle valve 718c in this order from the upstream side. The carbon dioxide dissolution module 714 is provided at the downstream end of the carbon dioxide gas line 717. The constant pressure valve 718a, the opening/closing valve 718b, and the variable throttle valve 718c constitute a carbon dioxide gas flow rate control mechanism 718.

The configurations of the deionized water flow rate control mechanism 713 and the carbon dioxide gas flow rate control mechanism 718 are not limited to those illustrated herein, but any configuration may be adopted as long as the deionized water and the carbon dioxide gas can flow into the carbon dioxide gas dissolution module 714 at a desirably controlled flow rate.

The carbon dioxide gas dissolution module 714 is configured by an internal liquid flow path (not illustrated) connected to the deionized water 712 and an injecting unit (not illustrated) that injects the carbon dioxide gas into the deionized water in the internal liquid flow path. The injecting unit may be configured by, for example, a hollow fiber membrane module. When a pressurized carbon dioxide gas is sent into the hollow fiber membrane, the carbon dioxide gas is dissolved in the deionized water flowing in the internal liquid flow path, thereby producing the carbon dioxide dissolved water. The configuration of a gas dissolution module for dissolving a gas (not limited to the carbon dioxide gas) in a liquid (not limited to the water) using the hollow fiber membrane module is known, and therefore, detailed descriptions thereof will be omitted. The form of the carbon dioxide gas dissolution module 714 is not limited to that using the hollow fiber membrane, but any form capable of dissolving a controlled amount of carbon dioxide gas in the deionized water may be used.

The ammonia water supply unit 720 includes an ammonia water line 722 connected to an ammonia water source 721. The ammonia water line 722 is provided with a constant pressure valve 723a, an opening/closing valve 723b, a variable throttle valve 723c, and a flow rate meter 724 in this order from the upstream side. From the ammonia water source 721, industrial ammonia water with an ammonia concentration of, for example, 30% is supplied.

Next, descriptions will be made on a method of supplying a buffer solution having a desired resistivity (not to cause electrostatic breakdown in device components; for example, 0.05 MΩ·cm or less) and a desired pH (in any range within 5 to 9; here, a value in a range of pH 7 to 8, which is slightly alkaline) to the tank 701 and the circulation line 702 of the processing fluid source 70.

A preliminary test (a test operation using the processing fluid source 70) is performed so as to confirm, in advance, conditions necessary to produce a buffer solution having desired resistivity and pH. Here, the necessary conditions include:

(1) the flow rate of the deionized water flowing in the deionized water line 712, the flow rate of the carbon dioxide gas flowing in the carbon dioxide gas line 717, and the resistivity of the resultant carbon dioxide dissolved water when the carbon dioxide dissolved water is produced in the carbon dioxide dissolved water supply unit 710; and (2) the amount (mixing ratio) of the ammonia water to be mixed with the carbon dioxide dissolved water produced based on (1).

Figure 11:
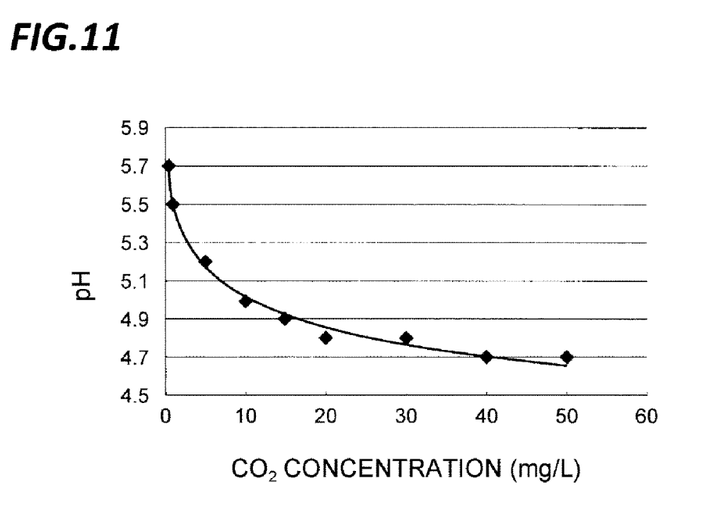
FIG. 11 is a graph illustrating a relationship between the carbon dioxide concentration and the pH in carbon dioxide dissolved water.
Figure 12:
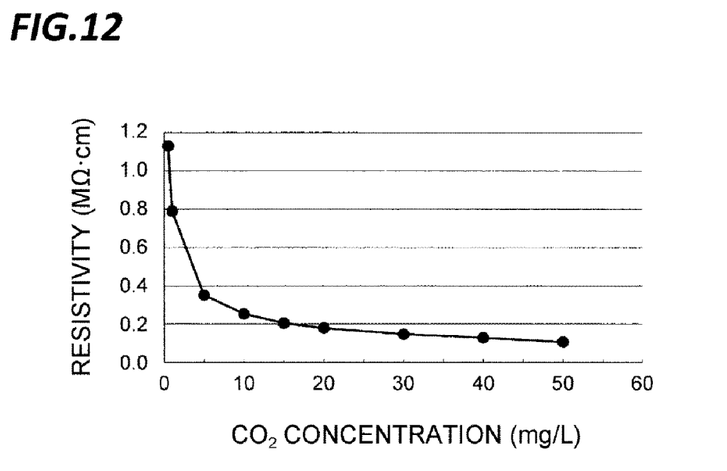
FIG. 12 is a graph illustrating a relationship between the carbon dioxide concentration and the resistivity in carbon dioxide dissolved water.

The graph of FIG. 11 illustrates a relationship between the carbon dioxide concentration in the carbon dioxide dissolved water and the pH of the carbon dioxide dissolved water. Further, the graph of FIG. 12 illustrates a relationship between the carbon dioxide concentration in the carbon dioxide dissolved water and the resistivity of the carbon dioxide dissolved water. Here, the target resistivity of the carbon dioxide dissolved water is assumed as 0.2 MΩ·cm. At this time, the carbon dioxide concentration in the carbon dioxide dissolved water is about 15 mg/L, and the pH of the carbon dioxide dissolved water is about 4.9. Near the resistivity of 0.2 MΩ·cm, the change in resistivity and the change in pH with respect to the change in carbon dioxide concentration are relatively gentle, so that the resistivity and the pH of the carbon dioxide dissolved water are relatively easily adjusted to desired values.

First, the deionized water is allowed to flow in the deionized water line 712 of the carbon dioxide dissolved water supply unit 710 at a flow rate determined in (1) above, and the carbon dioxide gas is allowed to flow in the carbon dioxide gas line 717 at a flow rate determined in (1) above. The carbon dioxide gas is dissolved in the deionized water in the carbon dioxide gas dissolution module 714 so as to produce carbon dioxide dissolved water. The carbon dioxide dissolved water flows into the tank 701. At that time, the resistivity of the carbon dioxide dissolved water is monitored by the resistivity meter 715, and the carbon dioxide dissolved water is discarded from a drain line 701a connected to the tank 701 until the resistivity reaches the target value (here, 0.2 MΩ·cm). When the resistivity detected by the resistivity meter 715 reaches the target value, the drain line 701a is closed, and the carbon dioxide dissolved water is stored in the tank 701. Alternatively, the deionized water 712 may be connected to a drain line 712a (indicated by a broken line in FIG. 3) via, for example, a three-way valve, so that the carbon dioxide dissolved water is discarded from the drain line 712a without being sent to the tank 701, until the resistivity detected by the resistivity 715 reaches the target value.

The pH of the carbon dioxide dissolved water produced by the above processing is less than 5 (e.g., 4.9). When the carbon dioxide gas is dissolved in the deionized water, $H^+$ ions and $CO_3^{2-}$ ions are produced, and the resistivity of the carbon dioxide dissolved water becomes a value corresponding to the concentration of the ions contained in the carbon dioxide dissolved water. Accordingly, it can be confirmed that a predetermined amount of carbon dioxide gas is dissolved in the deionized water based on the detection value of the resistivity meter 715.

When it is detected by a liquid level meter 706 that a predetermined amount of carbon dioxide dissolved water is stored in the tank 701, the pump 703 is operated to allow the carbon dioxide dissolved water to circulate in the circulation line 702. The resistivity of the carbon dioxide dissolved water actually flowing in the circulation line 702 may be confirmed from a resistivity meter 715' provided in the circulation line 702.

Next, the ammonia water in an amount determined in (2) above is supplied to the tank 701 by the ammonia water supply unit 720. Thus, the ammonia water is mixed with the carbon dioxide dissolved water circulating in the tank 701 and the circulation line 702, so that both are sufficiently blended to each other. Based on a time-integrated value of the measured values of the flow rate meter 724, it is possible to determine whether a predetermined amount of ammonia water is supplied to the tank 701. The ammonia water line 722 may be provided with a drain line 722a such that the ammonia water is discarded from the drain line 722a without being sent to the tank 701 until the flow rate is stabilized. Since the total amount of ammonia water sent to the tank 701 is small, the total amount of ammonia water sent to the tank 701 may be more precisely controlled by sending the ammonia water to the tank 701 at the stabilized flow rate.

As described at the beginning of the description, when the ammonia water is mixed with the carbon dioxide dissolved water, a neutralization reaction occurs. The pH of the mixed liquid may be set to a desired value in a range of pH 7 to 8. Further, the resistivity may also be set to a desired value (0.05 MΩ·cm or less). Due to the neutralization reaction, the following ions are present in the mixed liquid.

(Ionization Equilibrium)

(Full Ionization)

That is, the mixed liquid is a buffer solution of weak base and a salt thereof. As is known as a characteristic of the buffer solution, comparing with a solution in which $NH_3$ is solely dissolved in water, the pH of the buffer solution is smaller (closer to the neutrality), and when acid or base are added to the liquid, the change in pH also becomes smaller.

The resistivity of the buffer solution may be consistently or regularly monitored by the resistivity meter 715' provided in the circulation line 702. Further, the pH of the buffer solution may be regularly monitored by the pH meter 719 provided in the circulation line 702. Before the processing of the wafer W is started in the processing unit 16, it is desirable to confirm the resistivity (conductivity) and the pH of the buffer solution flowing in the circulation line 702. Further, when the pH is monitored, a sampling line (not illustrated) may be connected to the circulation line 702 such that the buffer solution is taken from the sampling line regularly, thereby performing the pH measurement in another place. Since the pH of the buffer solution is stable, it is unnecessary to frequently monitor the pH when the substrate processing system 1 is in a normal operating state. Further, the amount of ammonia supplied to the tank 701 may be feedback-controlled based on the value measured by the resistivity meter 715' or the pH meter 719.

Next, the advantages of the exemplary embodiment will be described.

Figure 4:
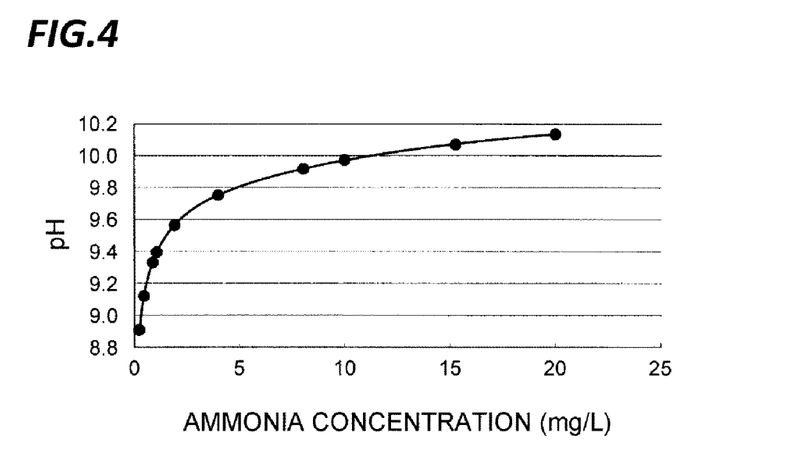
FIG. 4 is a graph illustrating a relationship between the ammonia concentration and the pH in dilute ammonia water.

FIG. 4 is a graph illustrating a relationship between the ammonia concentration and pH in the dilute ammonia water formed by adding the ammonia water to the deionized water. The ammonia concentration (mg/L) of the horizontal axis of the graph refers to a weight (mg) of the ammonia water of 30% concentration added to 1 L of the deionized water. As illustrated in the graph, since the change in pH with respect to the change in ammonia concentration becomes steeper as it approaches the neutrality, it can be seen that it is very difficult to produce dilute ammonia water having a pH of about 7 to 8.

Figure 5:
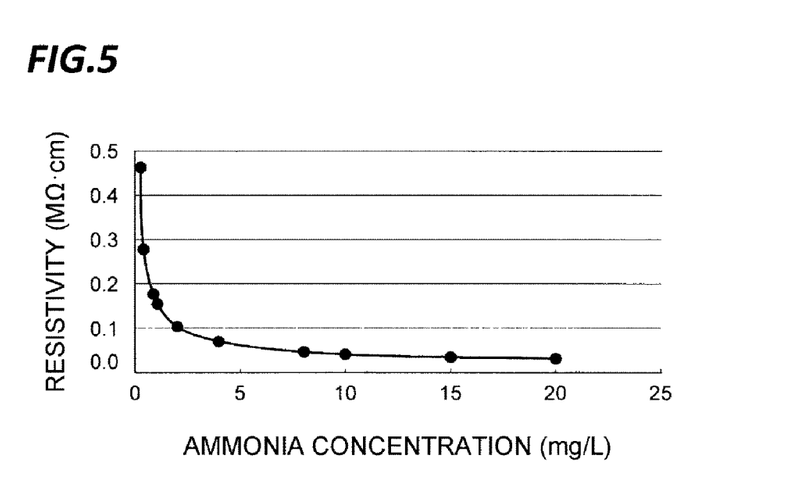
FIG. 5 is a graph illustrating a relationship between the ammonia concentration and the resistivity in dilute ammonia water.

FIG. 5 is a graph illustrating a relationship between the ammonia concentration (mg/L) and resistivity (MΩ·cm) in dilute ammonia water the dilute ammonia water formed by adding the ammonia water to the deionized water. As illustrated in the graph, as the ammonia concentration decreases, the resistivity sharply increases. Further, comparing the graph of FIG. 5 with the graph of FIG. 4, it can be seen that it is very difficult or impossible to achieve a low resistivity under a condition of low ammonia concentration as in a case of pH 9 or less.

Further, as is apparent from the graph of FIG. 11 referred above, since the change in pH with respect to the change in carbon dioxide gas concentration becomes steeper as it approaches the neutrality, it can be seen that it is very difficult to adjust the carbon dioxide dissolved water to have a desired concentration in pH 5 or more. Further, as is apparent from the graph of FIG. 12, since the resistivity sharply increases as the carbon dioxide gas concentration decreases, it can be seen that it is very difficult or impossible to achieve a low resistivity under a condition of low ammonia concentration as in a case of pH 5 or more.

Figure 6:
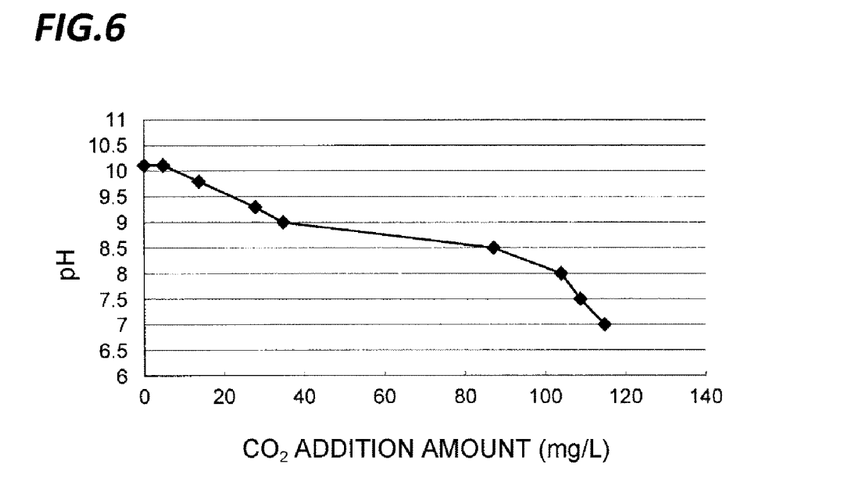
FIG. 6 is a graph illustrating a relationship between the addition amount of carbon dioxide gas and the pH when the carbon dioxide gas is dissolved in the ammonia water of pH 10.

FIG. 6 is a graph illustrating a relationship between the addition amount (mg/L) of the carbon dioxide gas and the pH when the carbon dioxide gas is dissolved in the dilute ammonia water obtained by adding the ammonia water to the deionized water to have pH 10. The $CO_2$ addition amount of the horizontal axis of the graph refers to a weight (mg) of the carbon dioxide gas bubbled to 1 L of the deionized water. It can be seen that about pH 7 to 8 is obtained in a relatively wide range of the carbon dioxide gas dissolution amount. This is the characteristic of the buffer solution described above.

Figure 7:
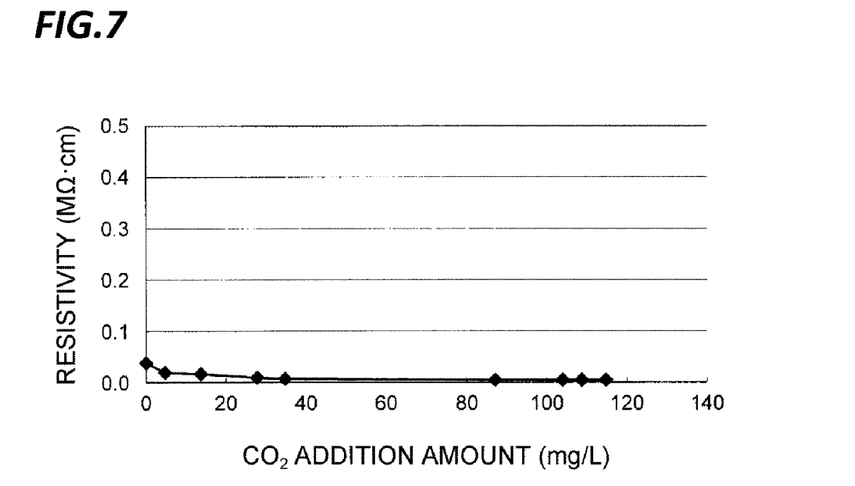
FIG. 7 is a graph illustrating a relationship between the addition amount of carbon dioxide gas and the resistivity when the carbon dioxide gas is dissolved in the ammonia water of pH 10.

FIG. 7 is a graph illustrating a relationship between the addition amount (mg) of carbon dioxide gas and resistivity (MΩ·cm) when the carbon dioxide gas is dissolved in the dilute ammonia water obtained by adding the ammonia water to the deionized water to have pH 10. From the graphs of FIGS. 4 and 5, the ammonia concentration in the dilute ammonia water of pH 10 is about 10 mg/L. At this time, the resistivity of the dilute ammonia water is about 0.05 MΩ·cm. When the carbon dioxide gas is added to the dilute ammonia water in this state, the pH is almost monotonously reduced as illustrated in FIG. 6. Meanwhile, the resistivity is also reduced as illustrated in FIG. 7 and maintained at a value lower than about 0.05 MΩ·cm when the carbon dioxide gas is not added thereto. This is because a large amount of electrolyte is contained in the buffer solution.

According to the exemplary embodiment described above, a slightly to weakly alkaline (about pH 7 to 8) buffer solution having a low resistivity may be obtained. Therefore, in a case where a device component that is possibly corroded by alkali (e.g., metal wiring) is exposed on the surface of the substrate, the corrosion of the device component may be minimized. Further, an electrostatic breakdown of the device component may be suppressed. Moreover, in the process of adding one of the ammonia water and the carbon dioxide gas to the deionized water and then adding the other, since the change in pH with the change in addition amount is dull, it is not necessary to strictly (very precisely) manage the addition amount of ammonia water or carbon dioxide gas. Since it is unnecessary to ultra-precisely control a minute flow rate required when the pH of the dilute ammonia water obtained by adding only the ammonia water to the deionized water (not dissolving the carbon dioxide) is adjusted to substantially the neutrality, no expensive flow rate control device is demanded. Of course, it is possible to obtain a weakly alkaline buffer solution having a pH of about 8 to 9 or a slightly to weakly acidic buffer solution having a pH of about 5 to 7 by changing the addition amount of carbon dioxide gas and the addition amount of ammonia water. That is, according to the exemplary embodiment, it is possible to easily produce a solution having a pH of about 5 to 9, which was difficult to be produced by adding only the ammonia water in the deionized water or adding only the carbon dioxide gas in the deionized water.

In the exemplary embodiment, the carbon dioxide gas is first dissolved in the deionized water to produce the carbon dioxide dissolved water, and the ammonia water is then added to the carbon dioxide dissolved water to produce the buffer solution. However, the present disclosure is not limited thereto. The ammonia water may be first added to the deionized water to produce the dilute ammonia water, and then, the carbon dioxide gas may be dissolved in the dilute ammonia water to produce the buffer solution.

When the carbon dioxide gas is first dissolved in the deionized water, it is confirmed in advance by the resistivity meter whether the resistivity of the obtained carbon dioxide dissolved water is a target value. The target resistivity of the carbon dioxide dissolved water may be set to a resistivity corresponding to a value smaller than pH 5, for example, pH 4.9. Then, the ammonia water is added to the carbon dioxide dissolved water to produce the buffer solution. The addition amount of ammonia water necessary to obtain the buffer solution having the target resistivity and pH is determined by an experiment in advance. And, when the buffer solution is produced in practice, the addition amount of ammonia water is managed using an instrument that is able to determine the total addition amount of ammonia water such as, for example, a flow rate meter, based on its measured value. After the buffer solution is produced, the actual resistivity and pH of the buffer solution are measured (confirmed) using a resistivity and a pH meter prior to supplying the produced buffer solution to the wafer W in practice.

When the carbon dioxide gas is first dissolved in the deionized water, the dissolution amount of carbon dioxide gas may be managed based on a measured value of resistivity (or conductivity) by a resistivity meter (or conductivity meter) that is easy to perform an in-line measurement. The addition amount of ammonia water may be measured directly (in a sense of a direct measurement of a liquid amount by the flow rate meter 724 rather than an indirect measurement through a resistivity like the measurement of the carbon dioxide dissolution amount) and precisely by, for example, a time-integrated value of measured values of the flow rate meter 724.

Further, when the carbon dioxide gas is dissolved in the deionized water, the dissolution amount of carbon dioxide gas may be managed based on the measured pH value by the pH meter. Otherwise, the dissolution amount of carbon dioxide gas may be managed using a measurement instrument capable of measuring the addition amount itself of the carbon dioxide gas such as, for example, a flowmeter. In this case, the addition amount of carbon dioxide gas to the deionized water necessary to obtain the target resistivity and pH is determined by an experiment in advance (see, e.g., the graphs of FIGS. 11 and 12).

Figure 3:
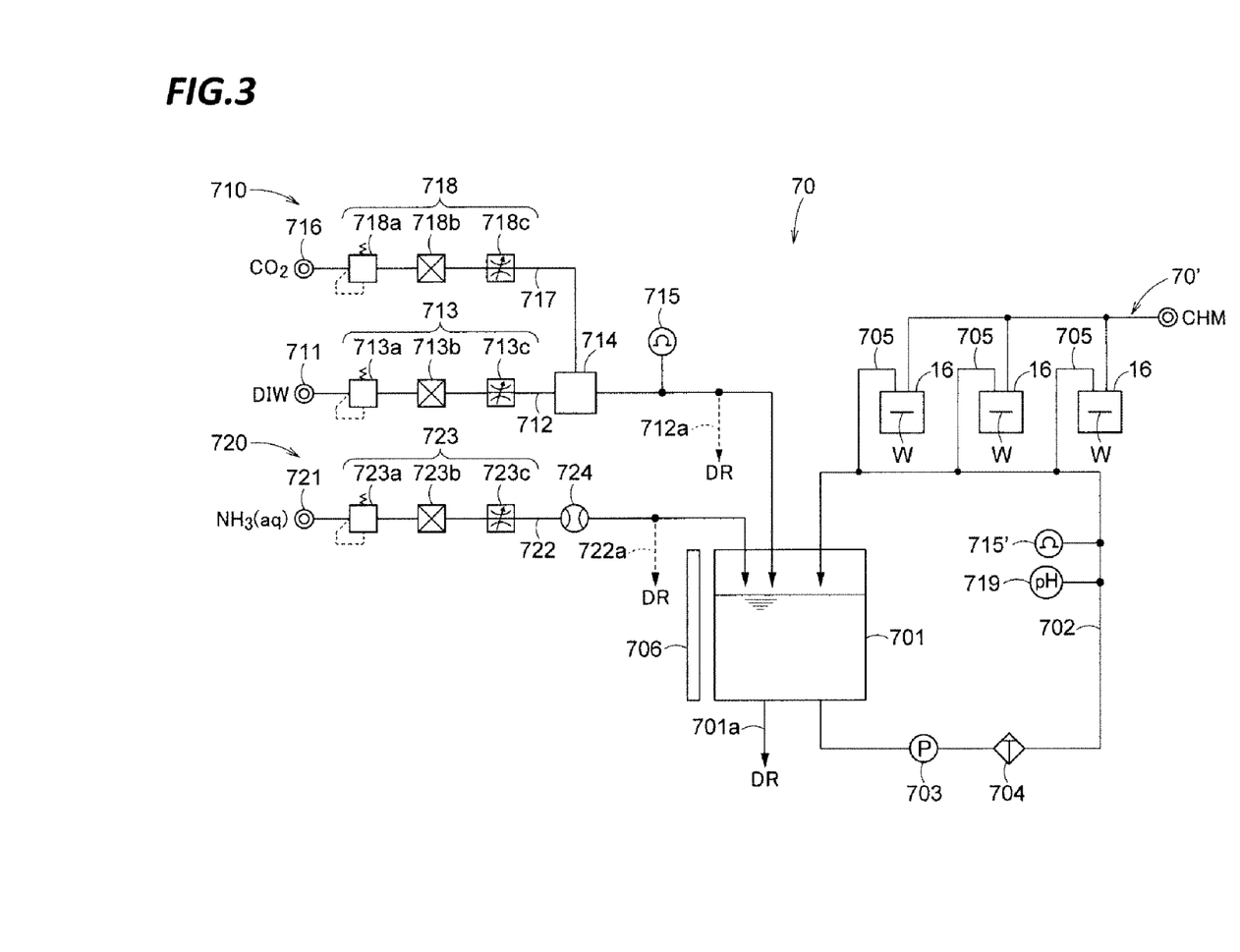
FIG. 3 is a piping diagram illustrating an exemplary configuration of the processing liquid supply unit illustrated in FIG. 2.

Further, in the configuration of FIG. 3, it is not necessary to manage the flow rate itself of the carbon dioxide gas flowing in the carbon dioxide gas line 717. And, it is only necessary to perform a feedback-control (adjust whether to narrow or open a flow path) of the carbon dioxide gas control mechanism 718 according to the detection value of the resistivity meter 715 by performing an initial setting of the carbon dioxide gas flow rate control mechanism 718 that is able to realize the target carbon dioxide dissolution amount.

When the ammonia water is first dissolved in the deionized water, a predetermined amount of ammonia water is dissolved in the deionized water in advance. The addition amount of ammonia water may be managed using an instrument that is able to determine the total addition amount of ammonia water such as, for example, a flow rate meter, based on its measured value. In this case, the addition amount of ammonia water necessary to have a value larger than pH 9, for example, pH 10, may be determined by an experiment in advance. As an alternative to determining the addition amount of ammonia water in advance, the ammonia water may be added to the deionized water while monitoring the resistivity and the pH until the target resistivity and the target pH (e.g., pH 10) are obtained. Then, the carbon dioxide gas is dissolved in the dilute ammonia water obtained by adding the ammonia water to the deionized water, to produce the buffer solution. At this time, the carbon dioxide gas is dissolved therein while monitoring the resistivity and the pH until the target resistivity and the target pH are obtained.

In a case where the ammonia water is first dissolved in the deionized water, when the carbon dioxide gas is dissolved in the dilute ammonia water, a predetermined amount of carbon dioxide gas may be dissolved in the dilute ammonia water. The dissolution amount of carbon dioxide gas may be measured by providing a flowmeter in the carbon dioxide gas line 717 to measure a bubbling amount and determining the relationship between the bubbling amount and the actual dissolution amount in advance.

Alternatively, the bubbling amount (injection amount to the deionized water) of the carbon dioxide gas may be estimated (calculated) by providing, on the carbon dioxide gas line 717, a pressure gauge (not illustrated) that measures a pressure at a primary side of the carbon dioxide gas dissolution module 714. That is, when the relationship between a time-integrated value of pressure measurement values by the pressure gauge and the bubbling amount of carbon dioxide gas (the total flow rate of the carbon dioxide gas flowing in the carbon dioxide gas line 717) is determined by an experiment in advance, the bubbling amount of carbon dioxide gas, furthermore, the dissolution amount of carbon dioxide gas in the deionized water may be determined by calculation based on the measured value of the pressure gauge.

As long as the composition management of the buffer solution is performed using the pH meter, the carbon dioxide gas may be first dissolved in the deionized water or the ammonia water may be first dissolved in the deionized water. However, when the carbon dioxide gas is first dissolved and the ammonia water is then added, the composition management of the buffer solution may be easily performed.

Figure 8:
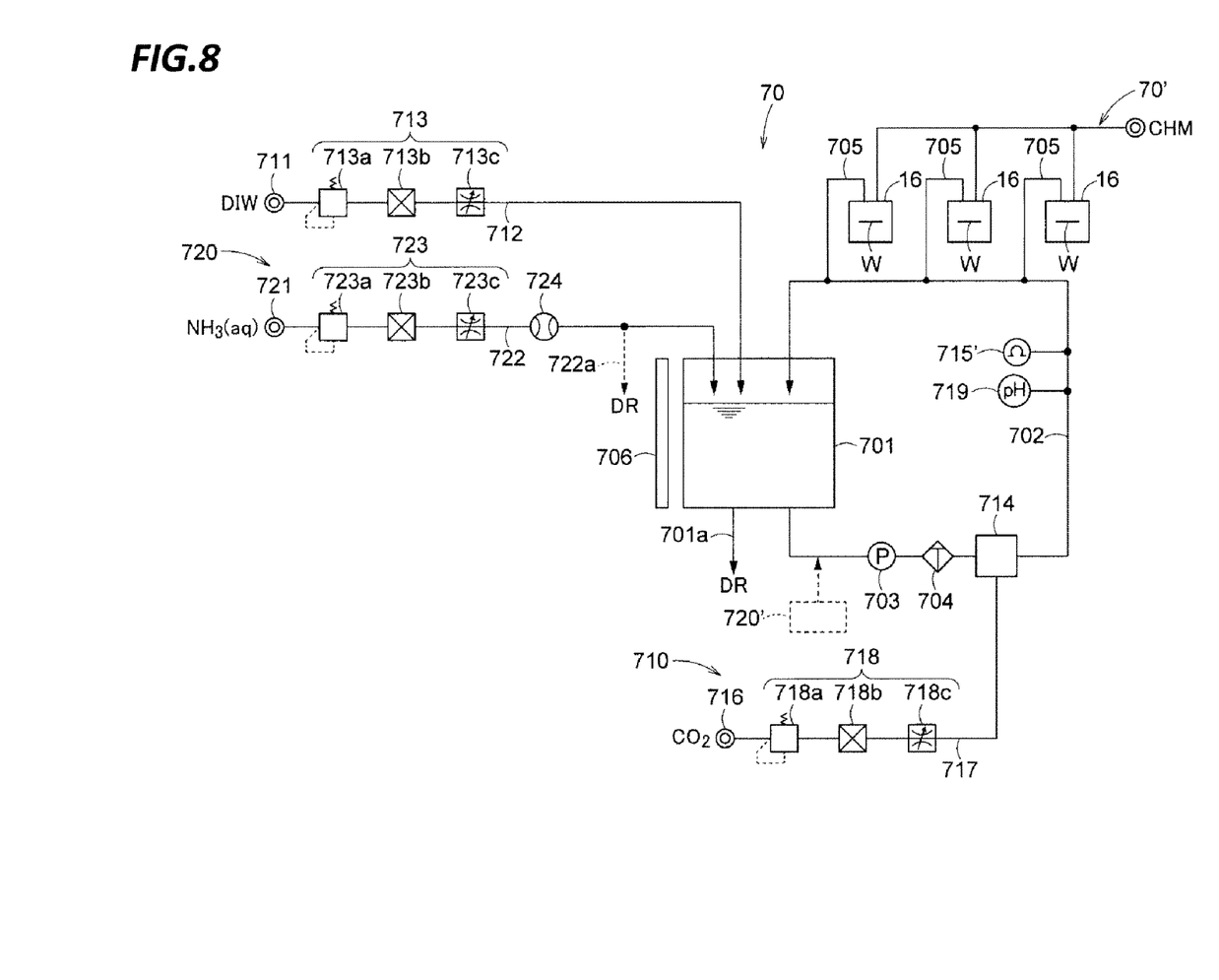
FIG. 8 is a piping diagram illustrating another exemplary configuration of the processing liquid supply unit illustrated in FIG. 2.

The configuration of the processing fluid source 70 is not limited to that illustrated in FIG. 3, and may be, for example, the one illustrated in FIG. 8. That is, the carbon dioxide gas dissolution module 714 may be removed from the deionized water 712 and provided in the circulation line 702. In FIG. 8, the components that are the same as those illustrated in FIG. 3 will be denoted by the same symbols, and duplicate descriptions will be omitted.

Hereinafter, descriptions will be made on an exemplary operation of a processing fluid source 70 illustrated in FIG. 8. First, a predetermined amount of deionized water is supplied from a deionized water line 712 to a tank 701, and a predetermined amount of ammonia water is supplied from an ammonia water line 722 to the tank 722. The liquid (deionized water and ammonia water) in the tank 701 is allowed to circulate in a circulation line 702 by driving a pump 703, so that the deionized water and the ammonia water are sufficiently mixed to produce dilute ammonia water. Thereafter, while continuing the circulation of the dilute ammonia water in the circulation line 702, carbon dioxide gas is supplied from a carbon dioxide gas line 717 to the carbon dioxide gas dissolution module 714, and the carbon dioxide gas is dissolved in the dilute ammonia water to produce a buffer solution. In this case, a resistivity meter 715' provided in the circulation line 702 may be used to confirm that a predetermined amount of ammonia water is added to the deionized water.

Hereinafter, descriptions will be made on another exemplary operation of the processing fluid source 70 illustrated in FIG. 8. First, a predetermined amount of deionized water is supplied from the deionized water line 712 to the tank 701. While allowing the deionized water to circulate in the circulation line 702, carbon dioxide gas is supplied from the carbon dioxide gas line 717 to the carbon dioxide gas dissolution module 714, so that the carbon dioxide gas is dissolved in the deionized water to produce a carbon dioxide dissolved liquid. Thereafter, while continuing the circulation of the carbon dioxide dissolved liquid, a predetermined amount of ammonia water is supplied from the ammonia water line 722 to the tank 701. The circulation of the liquid continues in the circulation line 702, so that the ammonia water is sufficiently mixed into the carbon dioxide dissolved liquid to produce a buffer solution. In this case, the resistivity meter 715' provided in the circulation line 702 may be used to confirm that a predetermined amount of carbon dioxide gas is dissolved in the deionized water.

In the exemplary embodiments of FIGS. 3 and 8, the ammonia water supply unit 720 supplies ammonia water to the tank 701, but is not limited thereto. The ammonia supply unit 720 may be provided at a proper position in the circulation line 702, for example, at a downstream side of the tank 701 as indicated by reference numeral 720' in FIG. 8 so as to supply the ammonia water to an upstream side of the pump.

Figure 9:
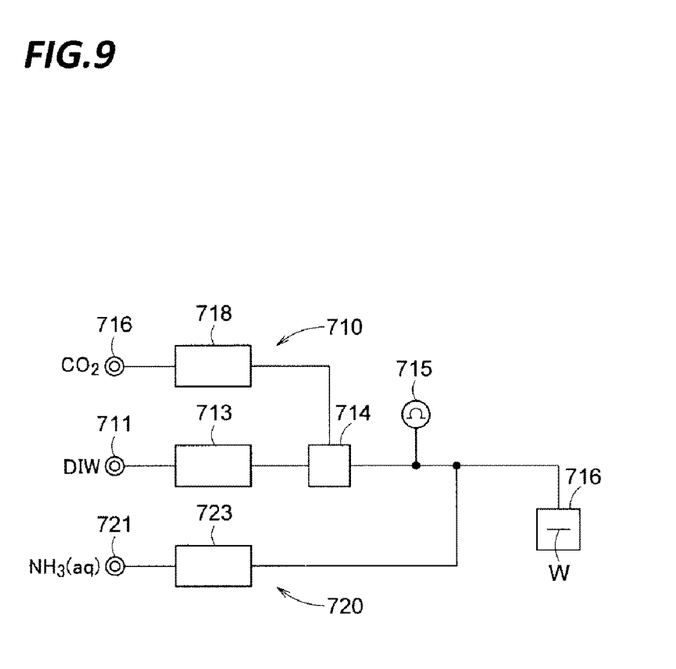
FIG. 9 is a piping diagram illustrating still another exemplary configuration of the processing liquid supply unit illustrated in FIG. 2.

In the exemplary embodiments of FIGS. 3 and 8, the processing fluid source 70 includes the tank 701 and the circulation line 702, but is not limited thereto. For example, as schematically illustrated in FIG. 9, the ammonia water line 722 of the ammonia water supply unit 720 may merge into the carbon dioxide gas line 717 of the carbon dioxide dissolved water supply unit 710, and the buffer solution produced by mixing the carbon dioxide dissolved water and the ammonia water in the merging portion may be supplied directly to the processing unit 16. In this case, a mixing valve (not illustrated) may be provided in or near the merging portion of the carbon dioxide gas line 717 and the ammonia water line 722 so as to facilitate the mixing. Further, in the case of the exemplary embodiment of FIG. 9, the concentration of the ammonia water supplied from the ammonia water supply unit 720 may be set to be relatively low (e.g., about 1%).

The processing unit 16 sequentially performs, for example, (Step 1) a chemical liquid cleaning processing or a wet etching processing performed by supplying a chemical liquid, which is supplied from a chemical liquid source 70' (see, e.g., FIGS. 3 and 8), from the processing fluid supply unit 40 (e.g., a nozzle) to the wafer 40, while rotating the wafer W held horizontally by the substrate holding mechanism, around the vertical axis;

(Step 2) a rinse processing performed by supplying the buffer solution from the processing fluid supply unit 40 (e.g., another nozzle) to the wafer W while continuously rotating the wafer W; and (Step 3) a spin drying processing (shake-off drying) performed by stopping the supply of the liquid to the wafer W while continuously rotating the wafer W.

When an ammonium carbonate solution is dried, the solution becomes a solid powder. Therefore, when step (2) proceeds directly to step (3), the buffer solution remaining on the wafer W is dried without being shaken off from the wafer W to produce a solid powder which, in turn, possibly becomes particles. If the particles are problematic, (step 2.1) a rinse processing performed by supplying deionized water or dilute ammonia water (e.g., about pH 9 to 10) from the processing fluid supply unit 40 (e.g., still another nozzle) while rotating the wafer W, may be added between step (2) and step (3). The rinse processing performed by supplying deionized water or dilute ammonia water (e.g., about pH 9 to 10) may be performed in a shorter period of time than the rinse processing performed by supplying the buffer solution.

When the deionized water rinse is performed, electrostatic charge causing the electrostatic breakdown may occur due to the friction between the deionized water and the surface of the wafer. However, when the buffer solution remaining on the wafer W is completely substituted with the deionized water, the deionized water rinse is immediately stopped, so that the electrostatic charge of a problematic level may be avoided.

The buffer solution may be used for a pre-treatment of the chemical liquid cleaning processing (chemical liquid processing) for removing a polymer. Here, the polymer refers to, as is well-known to those skilled in the art, a reaction product generated on the surface of the wafer when dry etching a metal film such as, for example, aluminum, copper, titanium, or tungsten, or a silicon oxide film, a silicon nitride film, or an organic insulating film, which is formed on the surface of the semiconductor wafer, using a resist film as a mask. The chemical liquid used for removing such a polymer may be, for example, a liquid containing an organic alkali liquid such as dimethyl formamide, dimethyl sulfoxide, or hydroxylamine, a liquid containing an organic amine such as monoethanolamine or alkanolamine, an inorganic acid such as hydrofluoric acid or phosphoric acid, or a liquid containing an ammonium fluoride-based material.

Figure 10:
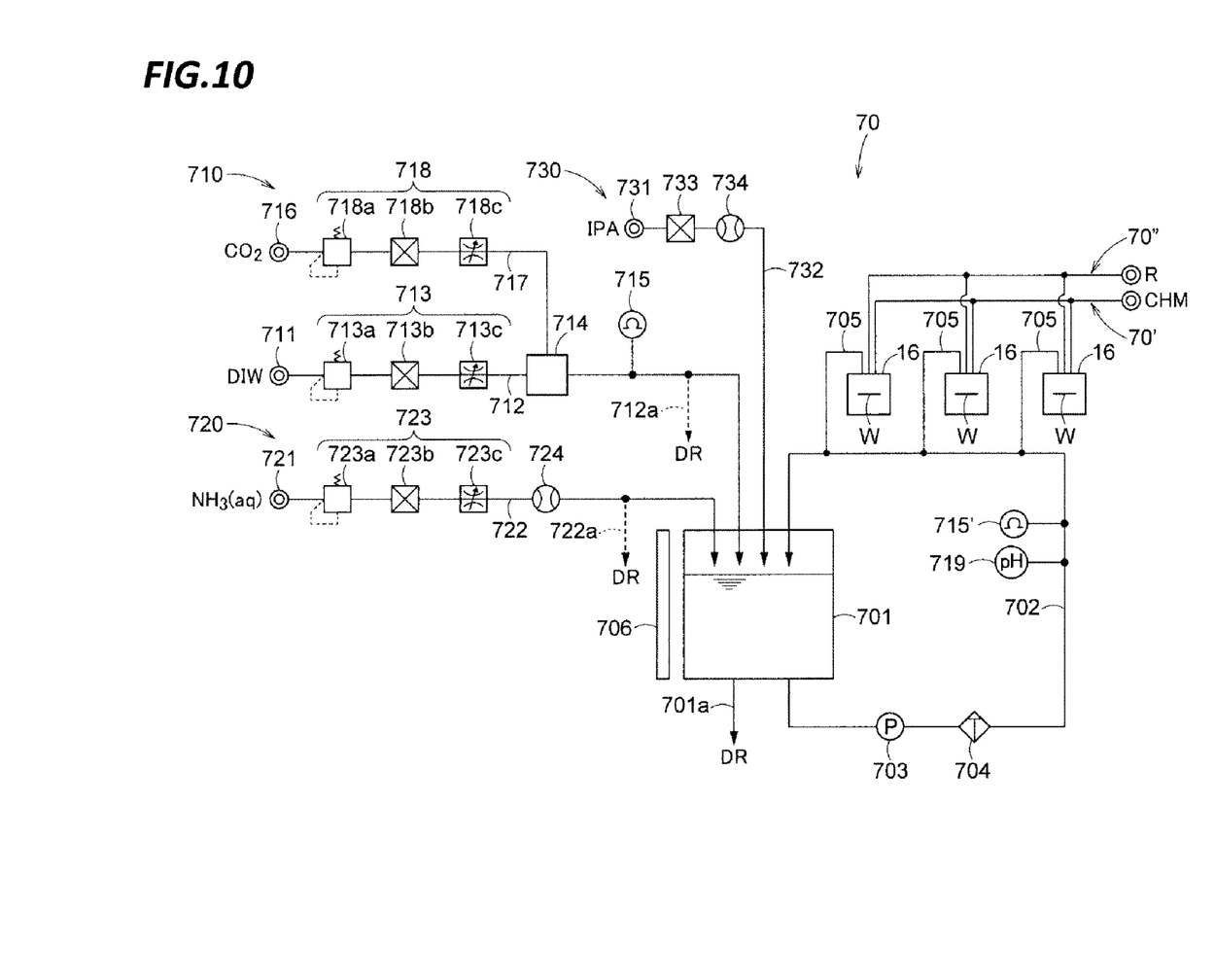
FIG. 10 is a piping diagram illustrating an exemplary configuration of a processing unit which may be used for performing a processing using a mixed liquid of isopropyl alcohol (IPA) with a buffer solution.

FIG. 10 illustrates a configuration of a substrate processing system in which the buffer solution is used for a pre-treatment of the polymer removing processing. The substrate processing system illustrated in FIG. 10 includes a solvent supply unit 730 that supplies a solvent such as isopropyl alcohol (IPA) to a tank 701 and a rinse liquid supply unit 70" that supplies a rinse liquid to each processing unit 16, in addition to the components included in the substrate processing system illustrated in FIG. 3. The solvent supply unit 730 includes a solvent line 732 that connects a solvent tank and the tank 701, an opening/closing valve 733 interposed in the solvent line 732, and a flow rate meter 734. The rinse liquid supplied by the rinse liquid supply unit 70" may be the buffer solution described above.

Hereinafter, descriptions will be made on an operation of the substrate processing system illustrated in FIG. 10. In the processing fluid source 70, after the buffer solution having a predetermined conductivity and a predetermined pH is produced according to the method described above, the IPA is supplied from the solvent supply unit 730 to the tank 701. The IPA is supplied such that a volume ratio of the IPA and the buffer solution is 1:1, and both are mixed sufficiently while flowing through the circulation system including the tank 701 and the circulation line 702.

The wafer W attached with a polymer after the dry etching is carried onto the surface of the processing unit 16, and the wafer W is held by the substrate holding mechanism 30. The wafer W is rotated, and the mixed liquid of the IPA and the buffer solution is supplied to the surface of the rotating wafer W, thereby performing the pre-treatment step of the polymer removing processing. Due to the mixed liquid, a residual gas component having a molecular level size (e.g., a fluorine-based gas used in the dry etching of the previous step) is removed by the buffer solution component in the mixed liquid. Further, the IPA in the mixed liquid permeates the polymer, so that the polymer is easily removed from the surface of the wafer W.

Next, while continuously rotating the wafer W (stopping the supply of the mixed liquid), the chemical liquid for removing the polymer described above is supplied as a chemical liquid to the wafer W from the chemical liquid supply unit 70', thereby performing the polymer removing step (chemical liquid cleaning step). Owing to the pre-treatment step, the residual gas component is removed from the surface of the wafer W and the IPA permeates the polymer. Therefore, the polymer may be easily removed from the surface of the wafer W.

Next, while continuously rotating the wafer W (stopping the supply of the polymer removing liquid), the buffer solution (not containing the IPA) is supplied as a rinse liquid to the wafer W from the rinse liquid supply unit, thereby performing the rinse step. Further, the mixed liquid of the IPA and the buffer solution may be used as a rinse liquid.

Next, the supply of the rinse liquid is stopped, and the drying step is performed to dry by shaking off the rinse liquid remaining on the wafer W while continuously rotating the wafer W. Prior to the drying step, a solvent substituting step of substituting the rinse liquid with the IPA may be performed by supplying the IPA to the wafer W.

In each exemplary embodiment described above, the processing target substrate is a semiconductor wafer, but is not limited thereto. The processing target substrate may be another substrate such as, for example, a glass substrate for liquid crystal display, or a ceramic substrate.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate liquid processing method comprising:
   producing a processing liquid including deionized water, carbon dioxide, and ammonia, the processing liquid having a pH in a range of pH 7 to pH 9 and a resistivity of 0.05 MΩ·cm or less; and
   processing a substrate having an exposed metal using the processing liquid generated in the producing the processing liquid,
   wherein the producing the processing liquid includes:
      dissolving the carbon dioxide in the deionized water to generate carbon dioxide dissolved water;
      discarding the carbon dioxide dissolved water until the carbon dioxide dissolved water reaches a target resistivity of 0.2 MΩ·cm as measured by a resistivity meter; and
      adding ammonia water including the ammonia to the carbon dioxide dissolved water having the resistivity of 0.2 MΩ·cm to adjust the pH of the processing liquid in the range of pH 7 to pH 9 and lower a resistivity of the processing liquid to a resistivity of 0.05 MΩ·cm or less.

2. The method of claim 1, wherein a predetermined dissolution amount of carbon dioxide is dissolved in the deionized water to obtain the resistivity of 0.2 MΩ·cm.

3. The method of claim 1, wherein in the dissolving the carbon dioxide, a resistivity of the carbon dioxide dissolved water is measured, and a dissolution amount of carbon dioxide in the deionized water is controlled such that the measured resistivity of the carbon dioxide dissolved water becomes a value equal to or less than the resistivity of 0.2 MΩ·cm of the carbon dioxide dissolved water.

4. The method of claim 1, wherein in the adding the ammonia water, a predetermined amount of ammonia water is added to the carbon dioxide dissolved water.

5. The method of claim 1, wherein the processing liquid is used for rinsing the substrate after the substrate is subjected to a chemical liquid processing.

6. The method of claim 1, wherein the processing liquid is used as a pre-treatment of a chemical processing on the substrate, and the pre-treatment is a first liquid processing that is performed on the substrate in a processing unit where the chemical processing is performed.

7. The method of claim 6, further comprising:
   mixing an organic solvent with the processing liquid before the processing liquid is supplied to the substrate.

8. A substrate liquid processing method comprising:
   producing a processing liquid including deionized water, carbon dioxide, and ammonia, the processing liquid having a pH in a range of pH 7 to pH 9 and a resistivity of 0.05 MΩ·cm or less; and
   processing a substrate having an exposed metal using the processing liquid generated in the producing the processing liquid,
   wherein the producing the processing liquid includes:
      dissolving the carbon dioxide in the deionized water to generate carbon dioxide dissolved water;
      discarding the carbon dioxide dissolved water until the carbon dioxide dissolved water reaches a target resistivity of 0.2 MΩ·cm as measured by a resistivity meter; and
      when the resistivity of the carbon dioxide dissolved water reaches 0.2 MΩ·cm, adding ammonia water including the ammonia to the carbon dioxide dissolved water having the resistivity of 0.2 MΩ·cm to adjust the pH of the processing liquid in the range of pH 7 to pH 9 and lower a resistivity of the processing liquid to a resistivity of 0.05 MΩ·cm or less,
   wherein a dissolution amount of carbon dioxide in the deionized water is controlled such that the measured resistivity of the carbon dioxide dissolved water becomes a value equal to or less than the resistivity of 0.2 MΩ·cm of the carbon dioxide dissolved water, and
   in the adding the ammonia water, a predetermined amount of ammonia water is added to the carbon dioxide dissolved water.

* * * * *